United States Patent [19]

Schwab et al.

[11] Patent Number: 4,979,287
[45] Date of Patent: Dec. 25, 1990

[54] TOOL FOR SEMICONDUCTOR CHIP REMOVAL

[75] Inventors: Ronald W. Schwab, Budd Lake; Arthur Eggers, Kenilworth, both of N.J.; Kenneth E. Blake, Sunnyvale, Calif.

[73] Assignee: Thomas & Betts Corporation, Bridgewater, N.J.

[21] Appl. No.: 365,394

[22] Filed: Jun. 13, 1989

[51] Int. Cl.$^5$ ............................................. H05K 13/04
[52] U.S. Cl. ......................................... 29/764; 29/741
[58] Field of Search .................. 29/764, 762, 741, 758

[56] References Cited

U.S. PATENT DOCUMENTS

| | | | |
|---|---|---|---|
| 4,141,138 | 2/1979 | Quick | 29/740 |
| 4,174,566 | 11/1979 | Smith | 29/758 |
| 4,392,301 | 7/1983 | Hannes et al. | 29/741 |
| 4,461,073 | 7/1984 | Harringer et al. | 29/741 |
| 4,507,861 | 4/1985 | Sprenkle | 29/741 |
| 4,521,959 | 6/1985 | Sprenkle | 29/741 |
| 4,583,287 | 4/1986 | McDevitt et al. | 29/741 |
| 4,583,288 | 4/1986 | Young | 29/741 |
| 4,597,174 | 7/1986 | Sevigny | 29/741 |
| 4,615,110 | 10/1986 | Crone | 29/741 |
| 4,660,281 | 4/1987 | Omand | 29/764 |
| 4,679,319 | 7/1987 | Grabbe et al. | 29/843 |
| 4,723,361 | 2/1988 | Carlson et al. | 29/764 |
| 4,744,140 | 5/1988 | Bright | 29/741 |
| 4,800,647 | 1/1989 | Guyer | 29/741 |
| 4,827,607 | 5/1989 | Korsunsky et al. | 29/741 |

OTHER PUBLICATIONS

Techni-Tool P.G.A. Extractor, Little Grip Dip Extractor p.T-78, undated.

Primary Examiner—Carl E. Hall
Attorney, Agent, or Firm—Robert M. Rodrick; Salvatore J. Abbruzzese

[57] ABSTRACT

Apparatus is provided for effecting removal of a semiconductive chip having an exteriorly-accessible surface and chip contacts depending therefrom from a chip carrier having an exteriorly-accessible surface and chip carrier contacts therein in retentive engagement with the chip contacts and with the chip carrier contacts being secured in a printed circuit board. The apparatus comprises a tool having mutually displaceable removal members adapted in a first tool state to bear respectively against an exteriorly-accessible surface of the chip and against an exteriorly-accessible surface of the chip carrier, neither of such removal members engaging the printed circuit board in such first state. The tool is operable from the first state to mutually displace the removal members for effecting removal of the chip from the carrier without either of the removal members engaging the printed circuit board.

10 Claims, 3 Drawing Sheets

TOOL FOR SEMICONDUCTOR CHIP REMOVAL

FIELD OF THE INVENTION

This invention relates generally to devices for the removal of semiconductive chips from chip carriers and pertains more particularly to improved devices providing removal of chips from chip carriers which are secured to printed circuit boards.

BACKGROUND OF THE INVENTION

For many years, microprocessors and like computer apparatus have been configured with printed circuit boards (PCBs) having semiconductive chip carriers or receptors secured thereto, with semiconductive chips releasably secured in the chip carriers. The chips have a generally rectangular array of male contacts depending therefrom and the chip carriers are configured with female contacts at their upper side for the receipt individually of the chip-dependent male contacts.

The chip carriers are further configured with male contacts electrically continuous with their female contacts and the former are inserted in PCB conductive strip apertures and then "free-flow" soldered thereto. The free-flow soldering provides electrical continuity from the chip male contacts to the PCB traces and also provides the full basis of mechanical securement of the chip carrier to the PCB.

There occurs need for the removal of chips from chip carriers, for various reasons, such as chip failure, and the art has seen various tools for this purpose, the function of the tools evidently being to impart uplifting force to the chip to overcome the engagement, frictional force pre-existing as between the chip male contacts and the chip carrier female contacts. This is a substantial frictional retention force to overcome since the chip male contact array can include a hundred or more individual contacts.

The prior art efforts in the chip tool removal field have, to applicants' considerations, not sufficiently met the industry requirements, particularly with respect to the integrity of electrical connection of the chip carrier and the PCB. Thus, the prior art tools operate in manner imparting forces as between the interface of the chip carrier and the PCB and may adversely effect the electrical connection thereof, which is fundamental to the electrical interconnection of the replacement chip and the chip carrier.

SUMMARY OF THE INVENTION

The present invention has as its primary object the provision of improved tools for the removal of chips from chip carriers secured to PCBs.

A more particular object of the invention is the provision of chip removal devices the operation of which may impact less adversely on the electrical interconnection interface between the chip carrier and the PCB than heretofore known devices of this character.

In attaining the foregoing and other objects, the invention provides a chip removal tool which includes mutually displaceable removal members bearing respectively against an exteriorly-accessible surface of the chip and against an exteriorly-accessible surface of the chip carrier, neither of such removal members bearing on the PCB in the course of chip removal.

More particularly, the invention provides apparatus for effective removal of a semiconductive chip having an exteriorly-accessible surface and chip contacts depending therefrom from a chip carrier having an exteriorly-accessible surface and chip receptor contacts therein in retentive engagement with the chip contacts. The apparatus comprises a chip-bearing platen having first arms extending therefrom for engagement with the chip exteriorly-accessible surface to bear thereon, and a chip carrier-bearing platen having second arms extending therefrom for engagement with the chip receptor exteriorly-accessible surface to bear thereon. The first arms extend through and beyond the chip carrier-bearing platen and the first and second arms each define bearing elements for common disposition between the exteriorly-accessible surfaces of the chip and the chip receptor. The platens are arranged for translation relative to one another, whereby the bearing elements are mutually displaced, effecting removal of the chip from the chip carrier. In particularly shown form, the apparatus includes operator-controllable handles for effecting displacement of the platens.

The apparatus is preferably adapted for use with diversely sized chips and chip carriers and hence is shown as further including operator-controllable members for effective displacement of the first and second arms relative to one another in a further direction, i.e., widthwise of the chip and carrier, to adapt the apparatus to diversely-sized chips and chip carriers. This feature also permits the operator to more easily attach the apparatus to the chip carrier.

The foregoing and other objects and features of the invention will be further understood from the following detailed description of preferred embodiments of the invention and from the drawings wherein like reference numerals identify like parts and components throughout.

DETAILED DESCRIPTION OF THE PREFERRED EMBODIMENT

Figure 1:
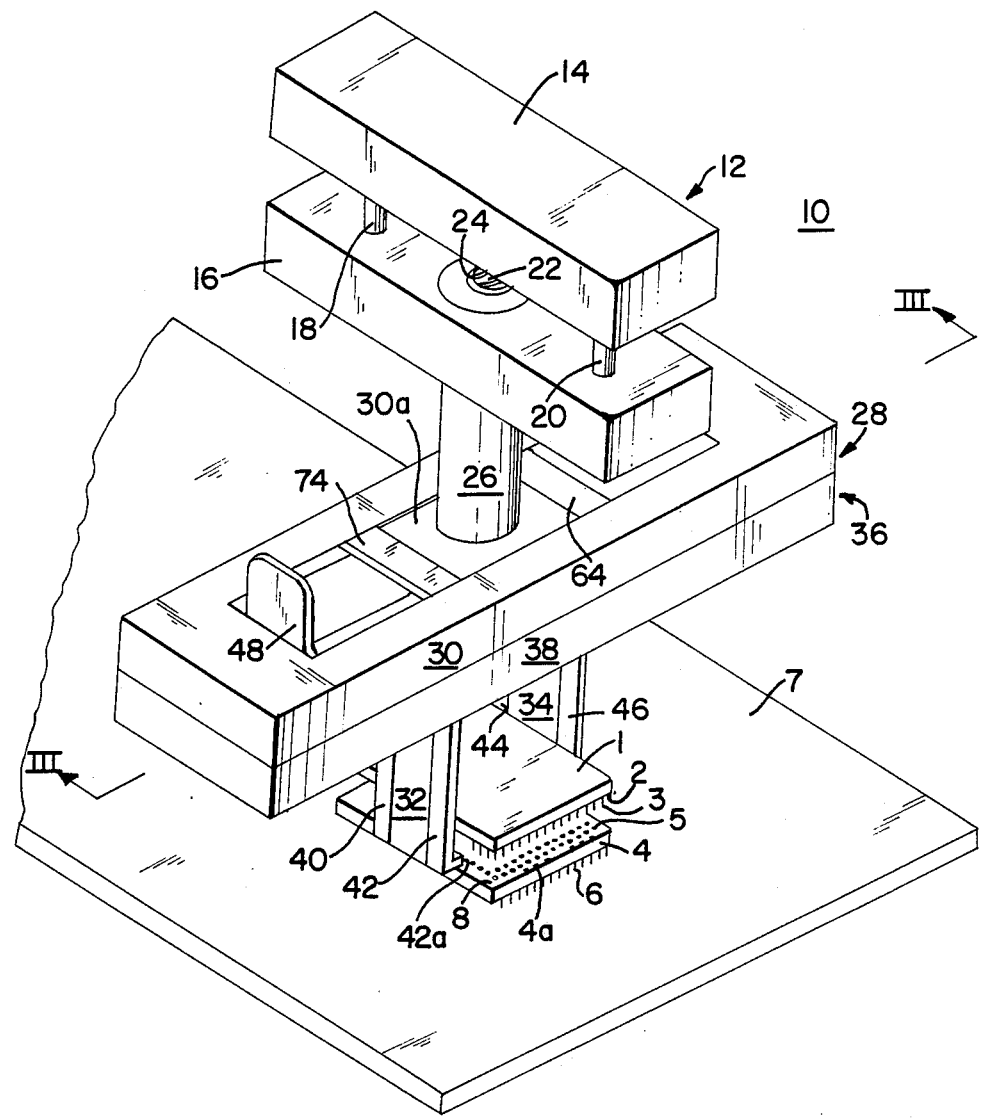
FIG. 1 is a perspective illustration of a preferred embodiment of a tool constructed in accordance with the invention, shown in its state of having removed a chip from a chip carrier.

Referring to FIG. 1, a semiconductive chip 1 has an exteriorly-accessible surface 2 and chip contacts 3 depending therefrom. A chip carrier or chip receptor 4 has contact sockets 5 for receiving contacts 4 and is itself soldered in place with its dependent contacts 6 in electrical communication with electrically conductive traces (not shown) of printed circuit board (PCB) 7. Chip carrier 4 has exteriorly-accessible surface 8. While a semiconductive chip 1 and accompanying chip carrier 4 is shown, the invention may also be employed with other types of electrical devices and associated connectors.

Tool 10 of FIG. 1, shown in operated relation, having removed the semiconductive chip from the chip receptor, includes an upper mechanism comprising operator-controllable handle unit 12 with an upper handle 14 and a lower handle 16, guides 18 and 20 controlling handle relative movement as for directionality.

Shaft 22 is secured to handle 14 and follows movement of handle 14 as an actuator, as is more fully discussed below. Spring 24 biases handles 14 and 16 into normal, vertically spaced, relation. Handle 16 has actuator shaft housing 26 fixedly dependent therefrom and in engagement with chip-bearing platen assembly 28, which includes platen 30 and depending arms 32 and 34.

Chip carrier-bearing platen assembly 36 includes platen 38 and depending arms 40, 42, 44 and 46. Width adjustment keys 48 and 50 (FIG. 2) are spring-biased outwardly relative to housing 26 by structure covered in detail hereinafter. The keys are moved by a user toward housing 26 and respectively operate on arms 34, 44 and 46 and arms 32, 40 and 42, displacing the former rightwardly and the latter leftwardly in FIG. 1.

In the course of reaching the FIG. 1 tool-operated state, an outset step involves the movement of keys 48 and 50 to dispose the platen arms outwardly of the sides of the chip and chip carrier. Next, with the bearing elements of the platen arms in respective alignment (FIG. 3), the keys are released and the bearing elements move under spring bias into the interstice existing between the assembled chip and carrier, i.e., the space between the chip undersurface and the carrier oversurface. Thereupon, handles 14 and 16 are pressed toward one another, effecting upward displacement of the chip relative to the chip carrier and removal of the chip from the carrier.

Of significance, alluded to above, is that no part of tool 10 bears contiguously upon PCB 7 in the course of the chip removal operation. Thus, once the tool is applied to the chip and carrier, the soldering interface between the carrier and the PCB is isolated from the removal operation.

Figure 2:
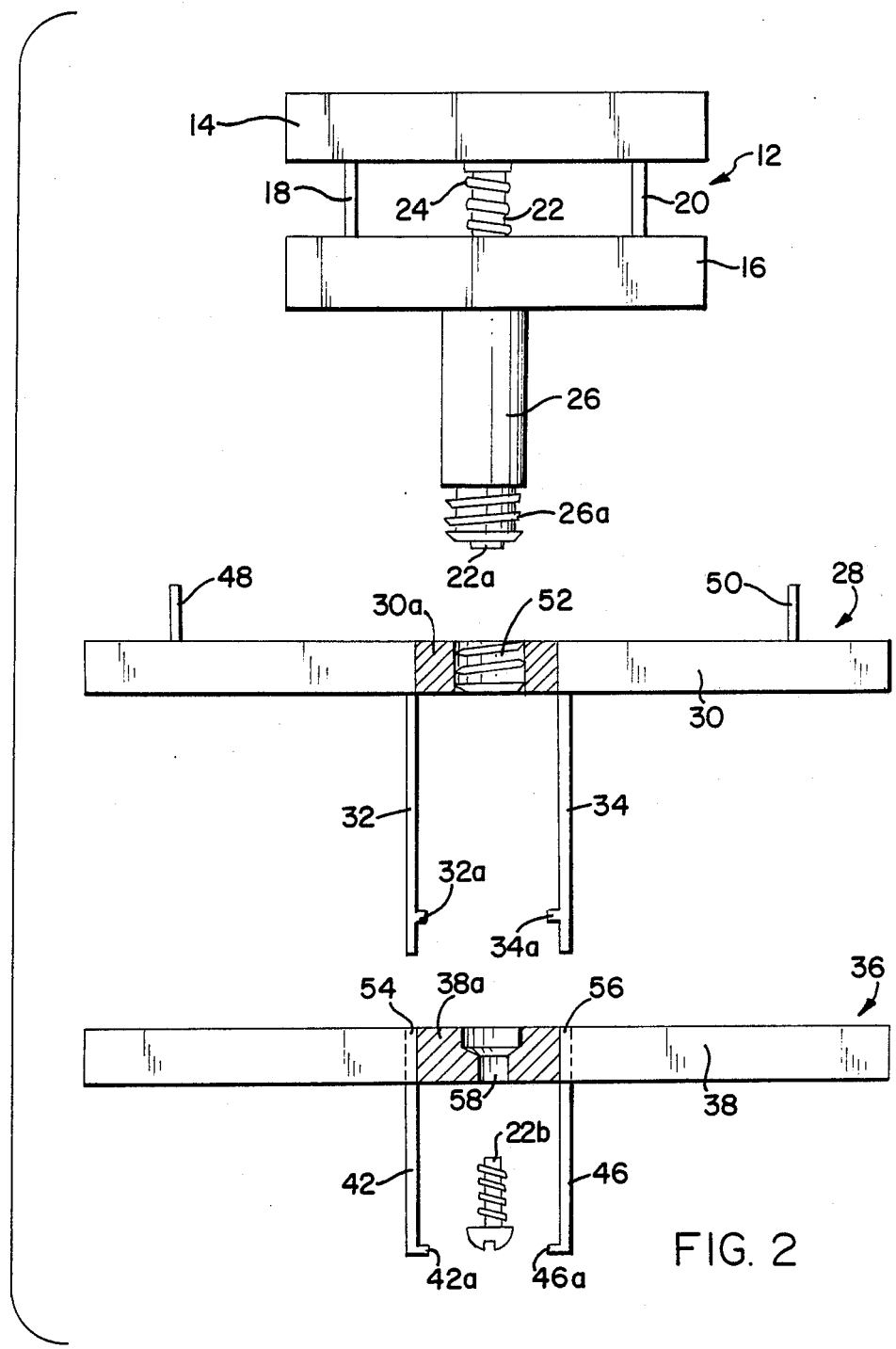
FIG. 2 is an exploded front elevational view of the several separate components of the tool of FIG. 1, broken apart and sectioned in part for showing of interior detail.

The components of tool 10 are seen in exploded manner in FIG. 2, wherein handle assembly 12 is shown rotated ninety degrees from its FIG. 1 disposition relative to platen assemblies 28 and 36. For this purpose, handle 16 may be rotatively secured to housing 26, with suitable keying to secure the handles in desired FIG. 1 orientation and to release them for movement into the FIG. 2 orientation, the former adapting the tool to the human hand for joint operation of keys 48 and 50 and handles 14 and 16, and the latter facilitating packing and storage of the tool.

In FIG. 2, it is seen that housing 26 has a threaded end 26a, actuator shaft 22 having extent to expose its end 22a below housing end 26a. Shaft end 22a is open and interiorly threaded for the receipt of a securing screw 22b. Handle assembly 12 is joined to platen assembly 28 by threading housing end 26a into interiorly-threaded bore 52, which extends fully through central piece 30a of platen 30.

The sets of platen arms shown in FIG. 2 will be seen to be in vertical alignment, e.g., arms 32 and 42 are aligned, as would also be arm 40, and arms 34 and 46 are aligned, as would also be arm 44. Passages 54 and 56 are formed through platen 38 to permit travel of arms 32 and 34 therethrough, beyond central piece 38a, into registry respectively between arms 40 and 42 and between arms 44 and 46, as is depicted in FIG. 1.

In the course of this last described tool assembly step, shaft end 22a becomes resident in conterbore 58 of piece 38a of platen 38. At this stage, screw 22b adapted to bear on the undersurface of platen 38, is threaded into shaft end 22a, thus securing the collective assembly of handle assembly 12, platen assembly 28 and platen assembly 36.

Operation of handles 14 and 16, by pressing them together, will now be seen to give rise to displacement of chip-bearing platen 30 upwardly relative to chip carrier-bearing platen 38 by bearing elements 32a and 34a, platen 38 being maintained in force relation with shaft end 22a and the oversurface of the chip carrier by bearing element 42a and its unshown counterpart on arm 40 and bearing elements 44a and 46a.

Figure 3:
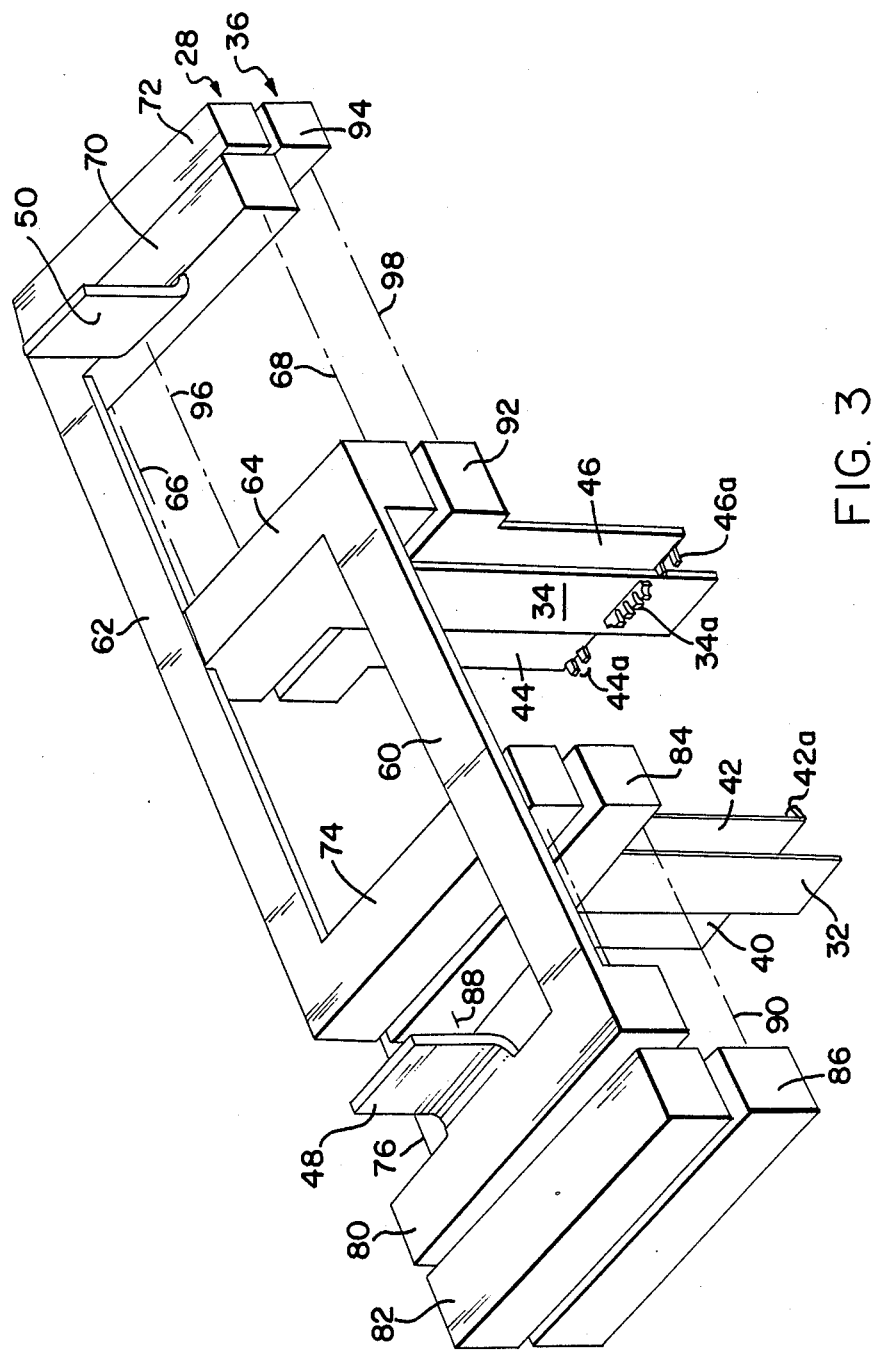
FIG. 3 is perspective illustration of the interior mechanisms of the chip-bearing platen and the chip carrier-bearing platen of FIG. 1 as seen from plane III-III thereof.

As is seen in FIG. 3, all of the bearing elements have common plane disposition in a first or unoperated state of the tool and, as is shown in FIG. 1, occupy vertically spaced planes in the operated state of the tool. The invention contemplates the provision of recesses, such as are shown at 4a in FIG. 1, configured for the ready receipt of the bearing elements at the chip and chip carrier interstice.

The interior mechanisms of platen assemblies 28 and 36 are shown in FIG. 3, with the central rigid pieces 30a and 38a of the assemblies, cross-hatched in FIG. 2, omitted for clarity of illustrating such mechanisms. Referring to FIG. 3, key 48 controls the movement of frame 60 and key 50 controls the movement of frame 62. Frame 60 has cross-member 64 at its rightward end, supporting arm 34. Springs 66 and 68, schematically shown, are disposed between cross-member 64 and cross-member 70 of frame 62. Block 72 is fixedly positioned and bears against cross-member 70.

Frame 62 has end cross-member 74 and springs 76 and 78 are disposed between cross-member 74 and cross-member 80 of frame 60. Block 82 is fixedly positioned and bears against cross-member 80. As will be seen, rightward displacement of key 48 displaces cross-member 64 and hence arm 34 rightwardly, against the bias of springs 66 and 68. Leftward displacement of key 50 displaces cross-member 74 and hence arm 32 leftwardly, against the bias of springs 76 and 78. The rest positions of the keys is as indicated, against the fixed blocks 72 and 82.

The mechanism interiorly of platen assembly 36 includes support 84 for arms 40 and 42, fixed block 86 and springs 88 and 90 urging support 84 away from block 86. Support 92 has arms 44 and 46 extending therebelow. Fixed block 94 and springs 96 and 98 urge support 92 into its illustrated rest position. As cross-members 64 and 74 are displaced, supports 84 and 92 follow their movements under the influence of springs 88, 90, 96 and 98.

Various changes may be introduced to the foregoing tool configuration and modifications may be made in the described method of its operation and use without departing from the invention. The particularly described and discussed embodiment and methods are thus intended in an illustrative and not in a limiting sense. The true spirit and scope of the invention are set forth in the following claims.

We claim:

1. Apparatus for effecting removal of a semiconductive chip having an exteriorly-accessible surface and chip contacts depending therefrom from a chip carrier having an exteriorly-accessible surface and chip carrier contacts therein in retentive engagement with said chip contacts, said apparatus comprising:

chip-bearing platen means having a chip-bearing platen and first arm means extending therefrom for engagement with said chip exteriorly-accessible surface to bear thereon;

chip carrier-bearing platen means having a chip carrier-bearing platen and second arm means extending therefrom for engagement with said chip carrier exteriorly-accessible surface to bear thereon;

said first arm means extending through and beyond said chip carrier-bearing platen, said first and second arm means each defining bearing elements commonly disposed in a first plane for disposition between said exteriorly-accessible surfaces of said chip and said chip carrier;

said chip-bearing platen means and said chip carrier-bearing platen means being movable relative to one another and thereby effecting movement of said first and second arm means to displace said bearing elements defined thereon into respective spaced planes;

first operator-controllable means for effecting such relative movement of said chip-bearing platen means and said chip carrier-bearing platen means; and second operator-controllable means for effecting displacement of said first and second arm means relative to one another in a direction permitting accommodation of diversely-sized chips therebetween for removal of said diversely-sized chip from said chip carriers.

2. Apparatus for effecting removal of a semiconductive chip having an exteriorly-accessible surface and chip contacts depending therefrom a chip carrier having an exteriorly-accessible surface and chip carrier contacts therein in retentive engagement with said chip contacts, said apparatus comprising:

chip-bearing platen means having a chip-bearing platen and first arm means extending therefrom for engagement with said chip exteriorly-accessible surface to bear thereon;

chip carrier-bearing platen means having a chip carrier-bearing platen and second arm means extending therefrom for engagement with said chip carrier exteriorly-accessible surface to bear thereon;

said first arm means extending through and beyond said chip carrier-bearing platen, said first and second arm means each defining bearing elements commonly disposed in a first plane for disposition between said exteriorly-accessible surfaces of said chip and said chip carrier;

said chip-bearing platen means and said chip carrier-bearing platen means being movable relative to one another and thereby effecting movement of said first and second arm means to displace said bearing elements defined thereon into respective spaced planes;

operator-controllable means for effecting displacement of said first and second arm means relative to one another to permit accommodation of diversely-sized chips therebetween for removal of said diversely sized chips from chip carriers.

3. The apparatus claimed in claim 1 wherein said first and second arm means each includes first and second arms, the first arms of said first and second arm means being commonly disposed in a second plane, the second arms of said first and second arm means being commonly disposed in a third plane spaced from said second plane.

4. Apparatus claimed in claim 1 wherein said chip-bearing platen means includes means imparting bias to said first arm means.

5. The apparatus claimed in claim 1 wherein said chip carrier-bearing platen means includes means imparting bias to said second arm means.

6. The apparatus claimed in claim 4 wherein said chip carrier-bearing platen means includes means imparting bias to said second arm means.

7. The apparatus claimed in claim 1 wherein said first operator-controllable means comprises first and second handle members, said first handle member having an actuator shaft and an actuator shaft housing depending therefrom, said actuator shaft being engaged with said chip carrier-bearing platen means, said actuating shaft housing being engaged with said chip-bearing platen means.

8. The apparatus claimed in claim 7, further including bias means for urging said first and second handle means in spaced relation from one another.

9. Apparatus for effecting removal of a semiconductive chip having an exteriorly-accessible surface and chip contacts depending therefrom from a chip carrier having an exteriorly-accessible surface and chip carrier contact therein in retentive engagement with said chip contacts and with said chip carrier contacts being secured in a printed circuit board, said apparatus comprising a tool having mutually displaceable removal members adapted in a first tool state to bear respectively against an exteriorly-accessible surface of the chip and against an exteriorly-accessible surface of the chip carrier, neither of such removal members engaging said printed circuit board in such first state, said tool including operator-controllable means for effecting displacement of said removal members relative to one another to accommodate therebetween diversely-sized chips to permit removal of said diversely-sized chips from chip carriers and for effecting removal of said chip from said carrier without either of said removal members engaging said printed circuit board.

10. Apparatus for effecting removal of an electrical device having an exteriorly-accessible surface and electrical contacts thereon from an electrical connector having an exteriorly-accessible surface and connector contacts therein in retentive engagement with said contacts of said electrical device said apparatus comprising;

electrical device-bearing platen means having an electrical device-bearing platen and first arm means extending thereform for engagement with said exteriorly-accessible surface of said electrical device to bear thereon;

connector-bearing platen means having a connector-baring platen and second arms means extending therefrom for engagement with said exteriorly-accessible surface of said electrical connector to bear thereon;

said first arm means extending through and beyond said connector-bearing platen said first and second arm means each defining baring elements commonly disposed in a first plane for disposition between said exteriorly-accessible surfaces of said electrical device and said connector;

said electrical device-bearing platen means and said connector-bearing platen means being moveable relative to one another and thereby effecting movement of said first and second arm means to displace said bearing elements defined thereon into respective spaced planes;

operator-controllable means for effecting such relative movement of said electrical device-bearing platen means and electrical connector-bearing platen means; and additional operator-controllable means for effecting displacement of said first and second arm means relative to one another to accommodate therebetween diversely-sized devices to permit removal of said diversely-sized electrical devices from said electrical connector.

* * * * *